(12) United States Patent
Gunasena et al.

(10) Patent No.: US 8,694,286 B2
(45) Date of Patent: Apr. 8, 2014

(54) MODIFYING A PARAMETRICALLY DEFINED MODEL WITH AN EXPLICIT MODELER

(75) Inventors: Udaya Gunasena, Tualatin, OR (US); Alan C. Cramer, West Linn, OR (US); Rahul Vora, Portland, OR (US); Jeff Strater, Portland, OR (US); Kevin J. Schneider, Portland, OR (US)

(73) Assignee: Autodesk, Inc., San Rafael, CA (US)

( * ) Notice: Subject to any disclaimer, the term of this patent is extended or adjusted under 35 U.S.C. 154(b) by 333 days.

(21) Appl. No.: 13/099,170

(22) Filed: May 2, 2011

(65) Prior Publication Data

US 2012/0084060 A1    Apr. 5, 2012

Related U.S. Application Data

(60) Provisional application No. 61/389,097, filed on Oct. 1, 2010.

(51) Int. Cl.
*G06F 17/50*    (2006.01)

(52) U.S. Cl.
CPC ..................................... *G06F 17/50* (2013.01)
USPC ................... 703/1; 700/97; 700/98; 345/419; 345/420

(58) Field of Classification Search
USPC .................... 703/1; 700/97–98; 345/419–420
See application file for complete search history.

(56) References Cited

U.S. PATENT DOCUMENTS

| | | | | |
|---|---|---|---|---|
| 5,815,154 | A | * | 9/1998 | Hirschtick et al. ............. 715/853 |
| 5,844,563 | A | * | 12/1998 | Harada et al. ................. 345/420 |
| 2012/0078580 | A1 | * | 3/2012 | Staples et al. ..................... 703/1 |

* cited by examiner

*Primary Examiner* — Eunhee Kim
(74) *Attorney, Agent, or Firm* — Gates & Cooper LLP

(57) ABSTRACT

A method, system, apparatus, article of manufacture, and computer readable storage medium provide the ability to manage modifications to a solid model between different modeling applications. An original model created using a parametrically-based modeler is obtained. A modified version of the original model that was edited using a history-free modeler is obtained. The original model and the modified version are analyzed to determine differences between them. Based on the differences, a set of parametric-based treatments are determined that, when performed on the original model, affect changes that produce a parametrically-driven version that geometrically matches the modified version. One or more of the treatments are individually selected and applied to produce the parametrically-driven version.

21 Claims, 7 Drawing Sheets

MODIFYING A PARAMETRICALLY DEFINED MODEL WITH AN EXPLICIT MODELER

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/389,097, filed Oct. 1, 2010, by Udaya Gunasena, Alan C. Cramer, Rahul Vora, Jeff Strater, and Kevin J. Schneider, entitled "MODIFYING A PARAMETRICALLY DEFINED MODEL WITH AN EXPLICIT MODELER,"

BACKGROUND OF THE INVENTION

1. Field of the Invention

The present invention relates generally to parametric modeling, and in particular, to a method, apparatus, and article of manufacture for modifying a parametrically defined model with an explicit modeler.

2. Description of the Related Art

Models may be created using parametric based modeling programs that maintain a history of operations used to create the model. Other direct/explicit modelers (i.e., modelers that do not maintain a history) may be used to edit/modify a model originally created using a parametric modeler. However, when such an edited model is opened back in a parametric modeler, if the geometry was edited, the feature history is lost. Such problems may be better understood with a description of prior art modelers and model editing.

With the evolution of software, designers have changed their fundamental approach to graphics design, moving from two-dimensional (2D) drawing systems to three-dimensional (3D) solid modeling systems. New software makes solid modeling technology available and affordable to virtually anyone.

Solid modeling is a technique that allows designers to create dimensionally accurate 3D solid models in a 3D space represented within a computer, rather than traditional 2D drawings. 3D solid models include significantly more engineering data than 2D drawings, including the volume, bounding surfaces, and edges of a design.

With the graphics capabilities of today's computers, these 3D solid models may be viewed and manipulated on a monitor. In addition to providing better visualization, 3D solid models may be used to automatically produce 2D drawing views, and can be shared with manufacturing applications and the like.

Some 3D solid modeling systems generate parametric feature-based models. A parametric feature-based model is comprised of intelligent features, such as holes, fillets, chamfers, etc. The geometry of the parametric feature-based model is defined by underlying mathematical relationships (i.e., parameters) rather than by simple unrelated dimensions, which makes them easier to modify. These systems preserve design intent and manage it after every change to the model.

Moreover, these features automatically change as the model is changed. The system computes any related changes to parts of the model that are dependent on a parameter, and automatically updates the entire model when the parameter is changed. Accordingly, the entire 3D model will update based on a new shape of a modified feature. In this regard, features in the model are recomputed based on modifications to parameters affecting such features. For example, a through-hole will always completely go through a specified part, even if the part's dimensions are changed to be bigger than the hole.

In parametric modelers, a history of how a particular object or body is created is created and maintained. In other words, the series of steps that were used to create the object/body is maintained in a history. Such steps can be modified at any point. However, to modify a particular step, the user is often required to search through a long history to find the step to modify.

In addition to parametric based modelers, 3D models may also be created/edited in a history-free (also known as "direct" or "explicit") based modeler. In an explicit modeler, no history is maintained and the feature/model is not recomputed based on a particular face/body modification. The advantage to the explicit modeler is that the user does not need to find a specific step in order to modify a body. If a face needs to be changed, the user can simply select and move the face. If such a task was to be accomplished in a parametric modeler, with a complex model, it might take a very long time to find the spot in the history in order to modify it. Moreover, there may be constraints that conflict with the edit or there may be "downstream" feature failures. Such issues can make the edit of a parametric model difficult.

Often times, one or more users may utilize a combination of both parametric modelers and explicit modelers to accomplish a given task. For example, an original 3D model may be created in a parametric model and then edited using an explicit modeler (e.g., the parametrically created model is opened in an explicit modeling application). As a further example, downstream users that are not experts with a parametric modeling program (e.g., packaging personnel, manufacturing personnel, analyst, quality assurance personnel, etc.) may need to edit a parametric model provided by a design engineer (e.g., if the product as designed will not fit in the packaging, or the product cannot be manufactured with a fillet in a certain configuration, etc.). Such downstream users may utilize an explicit modeler to perform the desired edits.

Once edits are made in an explicit modeler, the design engineer may want to incorporate the changes from the explicit model into the original parametric based model. However, the edits from the explicit modeler may have removed various features from the history. Consequently, prior art embodiments fail to maintain a history and fail to provide the ability to interchangeably use an explicit modeler and parametric modeler. Further, even if the parametric model attempted to create new history features that recreate/generates the same shape/body/edit from the explicit modeler, it can be difficult/impossible to find such a set of edits to the parametric model.

In view of the above, what is needed is a mechanism that provides the ability to perform edits in an explicit modeler while accurately reflecting such edits by updating the history in a parametric modeler.

SUMMARY OF THE INVENTION

There have always been a division between the different types of modelers—explicit/history-free modelers and parametric based modelers. Users have traditionally not been able to easily move from one model to the other and back because of the inherent nature of the two different modelers. Embodiments of the invention seek to provide users a method for going back and forth between the two different modelers and join the paradigms.

Embodiments of the invention solve the problem of tracking changes that are made by an explicit modeler (e.g., to a model initially created in a parametric modeler or to a model created in/by the explicit modeler), back to an original parametric model. A tool is used to display the differences between the models (or if the model was created in an explicit modeler, a proposed set of parametric based features) in a format that is natural for the user of a parametric history based computer aided design application. The tool presents the differences in smaller, specific changes, and provides a set of options of edits that will affect the change.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments of the invention provide a "Change Manager" as part of a graphics program that allows a user to modify a parametrically defined body with an explicit modeler and incorporate such changes into the original parametric model. To incorporate the changes made in an explicit modeler, the user goes back to using a parametric modeler and opens the model that was modified in the explicit modeler. The Change Manager performs an analysis of the changes based on the modified version and the original parametric model, and modifies the history to reflect the changes. Such a process is advantageous over the prior art which required the user to manually perform changes in the parametric modeler until the changes were matched in the parametric step. Accordingly, the Change Manager enhances the user's ability to move between modelers and make changes using the modeler of their choosing as the situation dictates.

Hardware Environment

Figure 1:
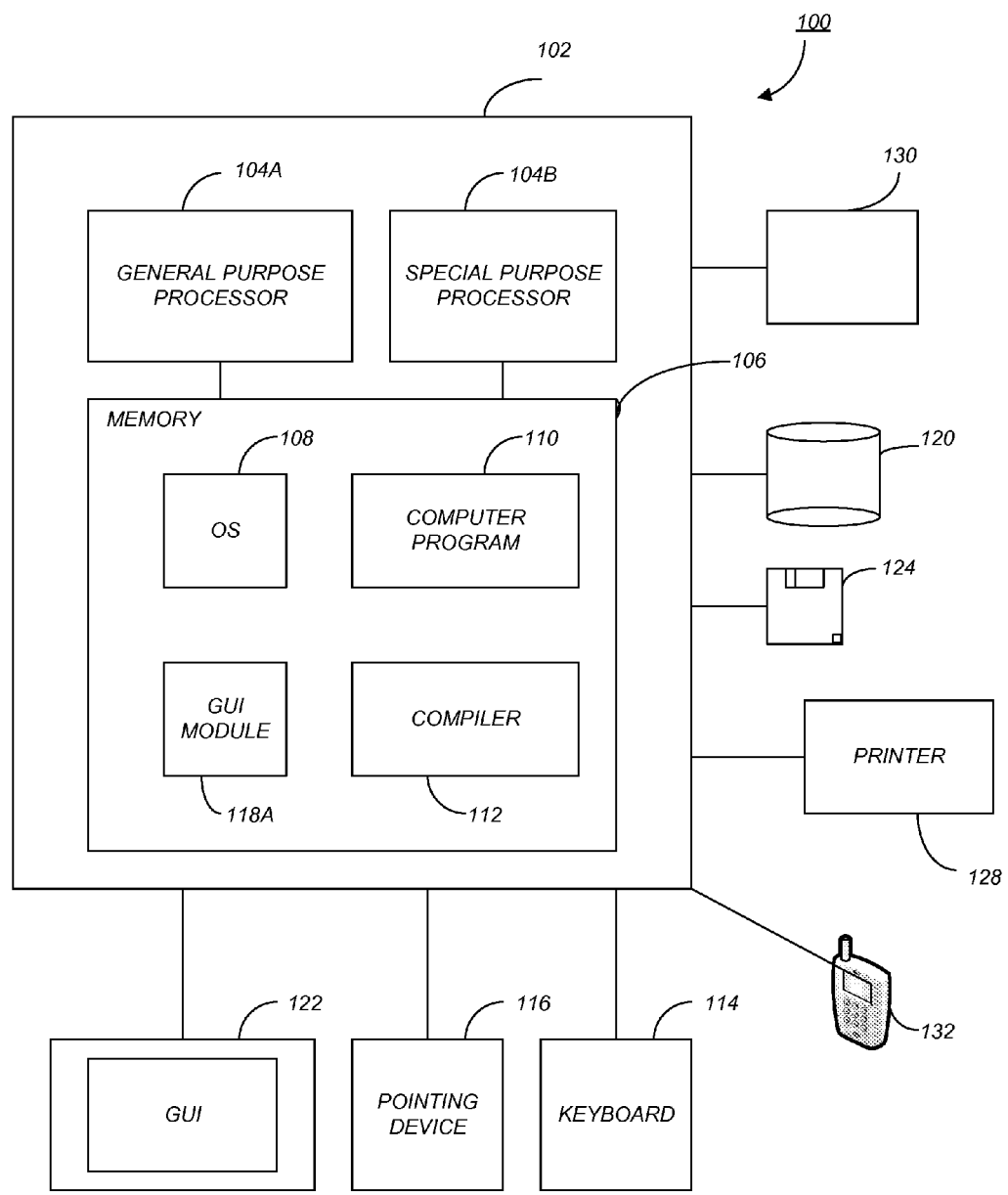
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to other devices, including input/output (I/O) devices such as a keyboard 114, a cursor control device 116 (e.g., a mouse, a pointing device, pen and tablet, etc.) and a printer 128. In one or more embodiments, computer 102 may be coupled to a media viewing/listening device 132 (e.g., an MP3 player, iPod™, Nook™, portable digital video player, cellular device, personal digital assistant, etc.).

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results. The computer program 110 preferably comprises a parametric feature-based solid modeling system or an explicit modeling system, although other graphics/solid modeling programs 110 could be used as well.

Output/results may be presented on the display 122 or provided to another device for presentation or further processing or action. In one embodiment, the display 122 comprises a liquid crystal display (LCD) having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Although the term "user computer" or "client computer" is referred to herein, it is understood that a user computer 102 may include portable devices such as cell phones, notebook computers, pocket computers, or any other device with suitable processing, communication, and input/output capability.

Figure 2:
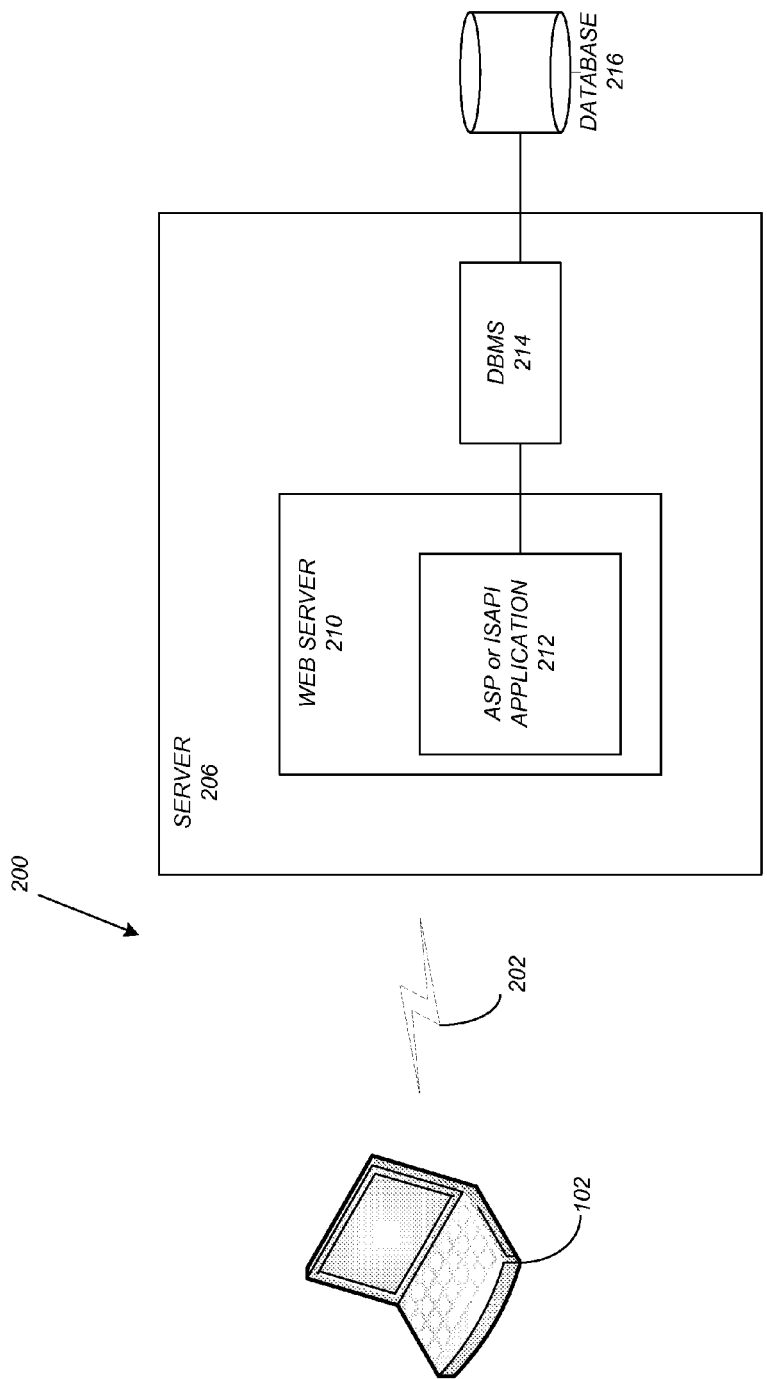
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 102 to server computers 206. A typical combination of resources may include a network 202 comprising the Internet, LANs (local area networks), WANs (wide area networks), SNA (systems network architecture) networks, or the like, clients 102 that are personal computers or workstations, and servers 206 that are personal computers, workstations, minicomputers, or mainframes (as set forth in FIG. 1).

A network 202 such as the Internet connects clients 102 to server computers 206. Network 202 may utilize Ethernet, coaxial cable, wireless communications, radio frequency (RF), etc. to connect and provide the communication between clients 102 and servers 206. Clients 102 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 102 may be downloaded from server computer 206 to client computers 102 and installed as a plug in or ACTIVEX™ control of a web browser. Accordingly, clients 102 may utilize ACTIVEX™ components/component object model (COM) or distributed COM (DCOM) components to provide a user interface on a display of client 102. The web server 210 is typically a program such as MICROSOFT'S INTERNENT INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of or connected directly to client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 206-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 102 and 206 may include portable devices such as cell phones, notebook computers, pocket computers, or any other device with suitable processing, communication, and input/output capability.

Of course, those skilled in the art will recognize that any combination of the above components, or any number of different components, peripherals, and other devices, may be used with computers 102 and 206.

Figure 3:
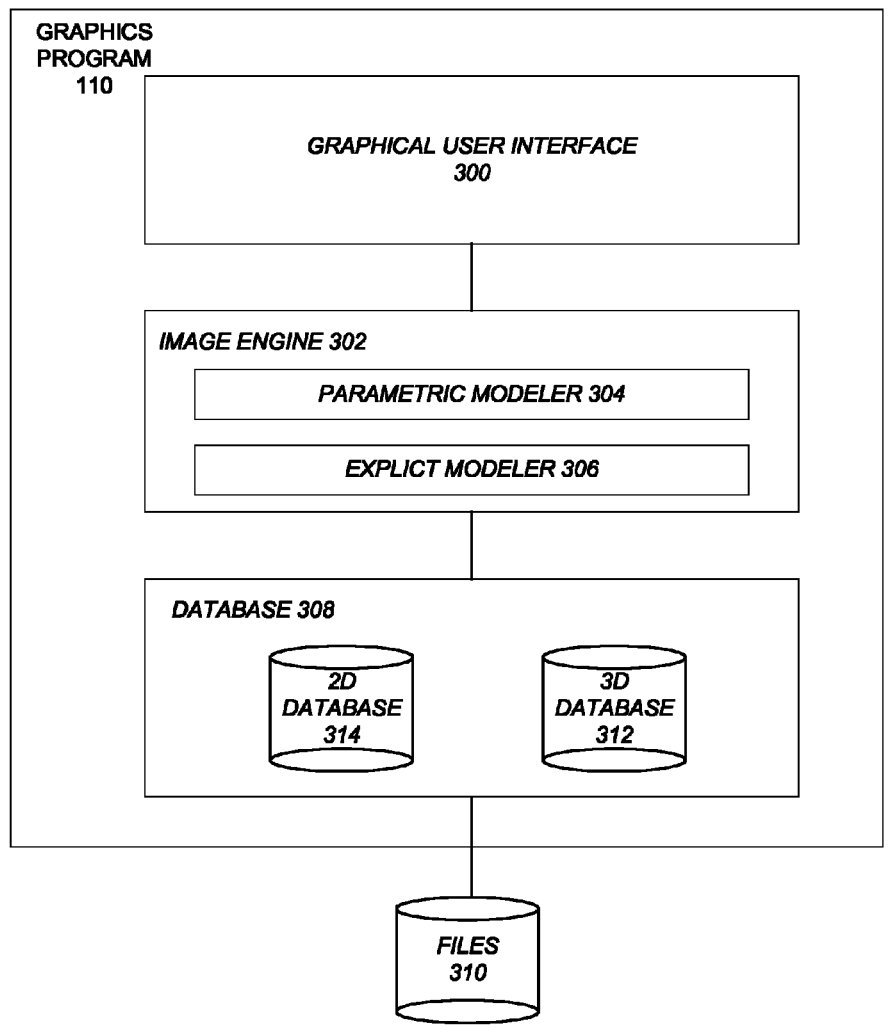
FIG. 3 is a block diagram that illustrates the components of a graphics computer program according to the preferred embodiment of the present invention.

FIG. 3 is a block diagram that illustrates the components of a graphics computer program 110 according to the preferred embodiment of the present invention. There are three main components to the graphics program 110, including: a Graphical User Interface (GUI) 300, an Image Engine (IME) 302 including a parametric modeler 304 and an explicit modeler 306, and a Database (DB) 308 for storing objects in files 310.

The Graphical User Interface 300 displays information to the user and provides the functionality for the user's interaction with the graphics program 310. The Image Engine 302 processes the Database 308 or files 310 and delivers the resulting graphics to an output device. In the preferred embodiment, the Image Engine 302 provides a complete application programming interface (API) that allows other computer programs to interface to the graphics program 310 as needed. The explicit modeler 306 primarily creates geometry and topology for models. The parametric modeler 304, which interacts with the explicit modeler 306, is a parametric feature-based solid modeler that integrates 2D and 3D mechanical design tools, including parametric assembly modeling, surface modeling, 2D design, and associative drafting. The parametric modeler 304 provides powerful solid-, surface-, and assembly-modeling functionality.

The Database 308 is comprised of two separate types of databases: (1) a 3D database 312 known as the "world space" that stores 3D information; and (2) one or more 2D databases 314 known as the "virtual spaces" or "view ports" that stores 2D information derived from the 3D information. The 3D database 312 captures the design intent and behavior of a component in a model.

Software Environment

As described above, a model may be originally created in a parametric modeler. The model may then be opened in an explicit modeler where the user modifies the model. Such modifications are not part of the feature history because they are performed in a history-free modeler. When the model is saved by the explicit modeler, two files may exist—the original parametric history based model (e.g., an ".ipt" file) and a history free model (e.g., a ".dwg" model).

The history free model is opened in the parametric modeler. When opened, the parametric modeler recognizes that the model originated from a parametric model and opens the original file. An analysis is performed to determine the changes and how they relate to the model history. Based on the analysis, edit options known as "treatments" are presented to the user. The user may then determine which treatments to apply.

Accordingly, embodiments of the invention analyze the models, discover a set of differences, tie the differences back to the original feature history and present a list of "treatments" or edits that can be applied to the parametric model features to affect the same results.

Figure 4A:
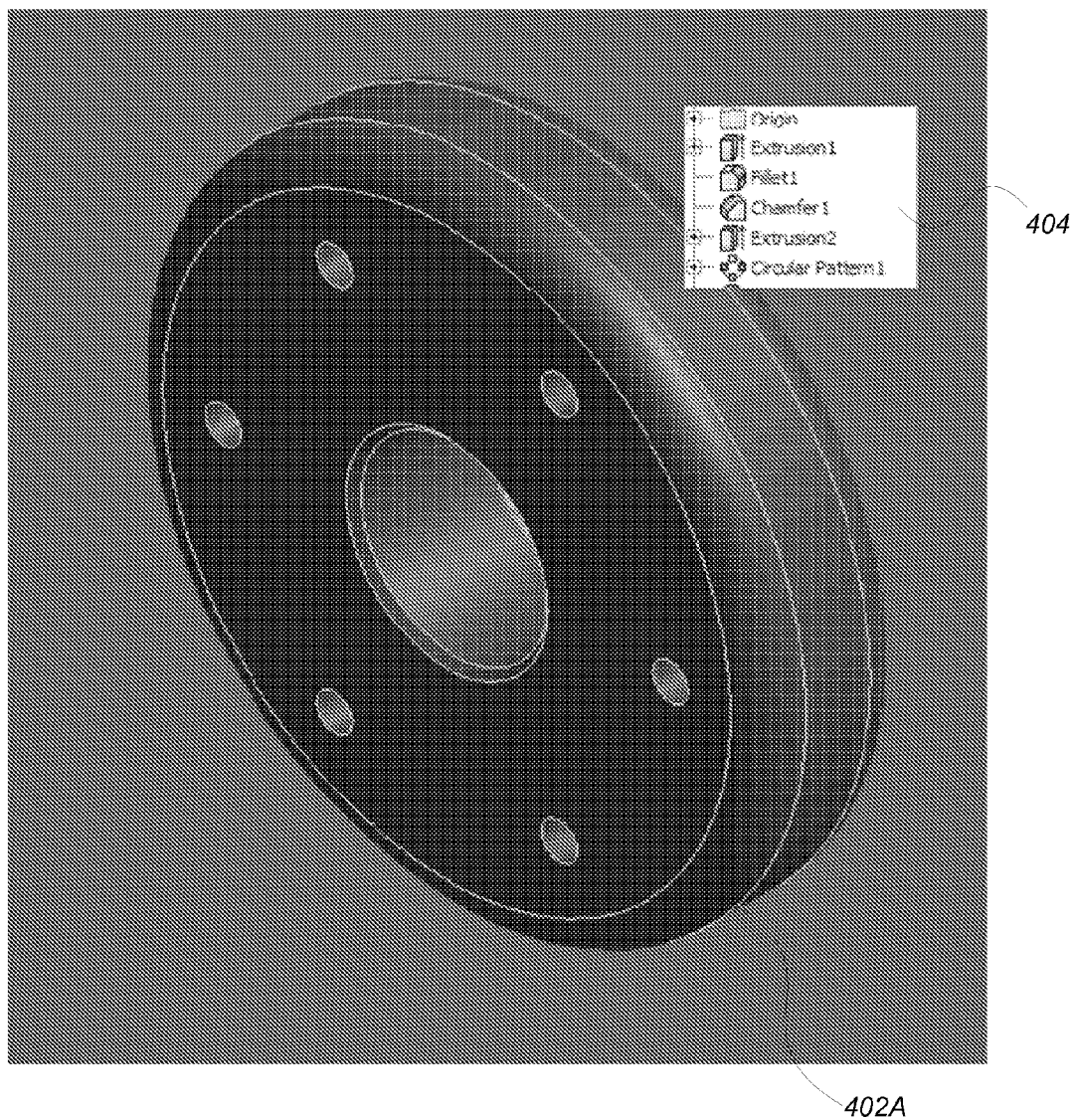
FIG. 4A illustrates an exemplary parametric, feature based, associative model that has been created in a parametric modeler in accordance with one or more embodiments of the invention.
Figure 4B:
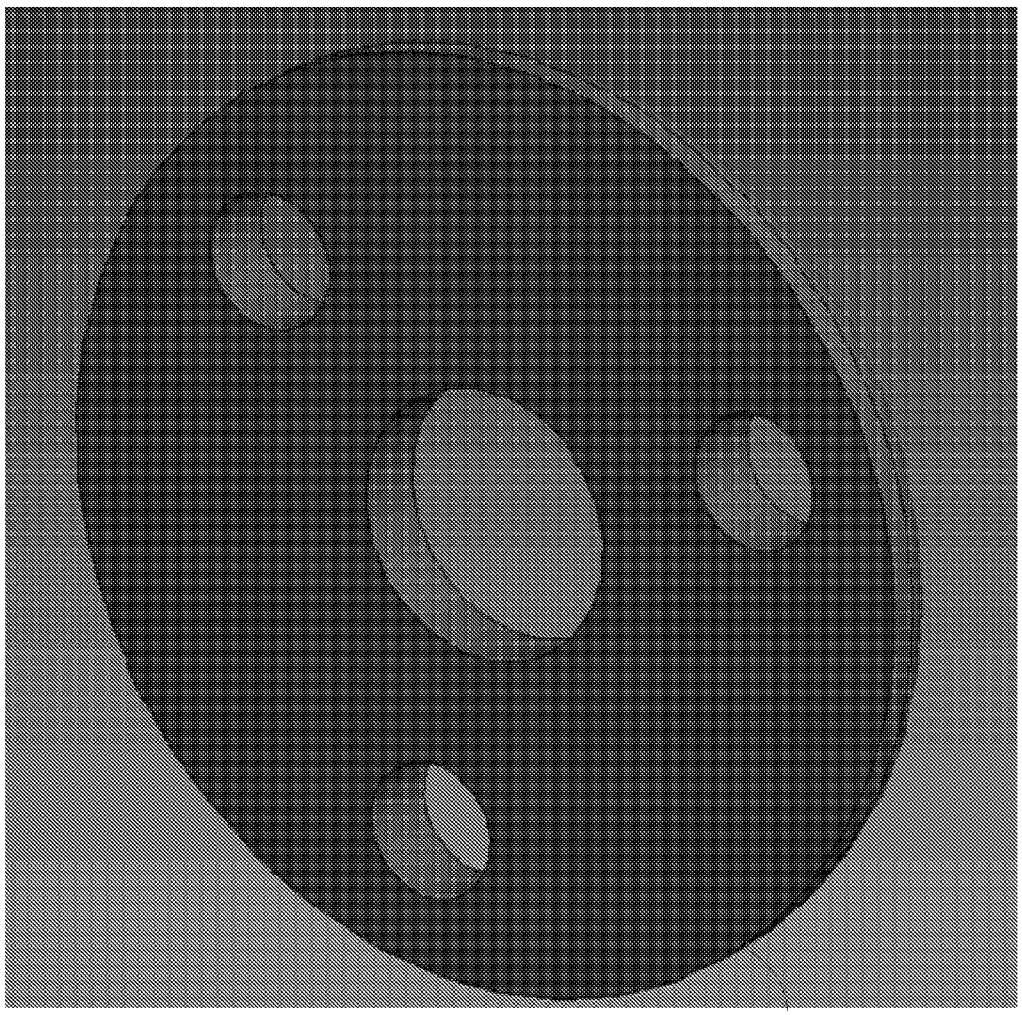
FIG. 4B illustrates the same model of FIG. 4A after being modified in a history-free modeler in accordance with one or more embodiments of the invention.

FIG. 4A illustrates an exemplary parametric, feature based, associative model that has been created in a parametric modeler in accordance with one or more embodiments of the invention. The feature history for the model 402A is illustrated in window 404. The feature history indicates various extrusions, a fillet, a chamfer, and a circular pattern. Once created, an explicit modeler may be used to edit the model 402A. FIG. 4B illustrates the same model 402A of FIG. 4A after being modified in a history-free modeler (resulting in model 402B). The modifications in the history-free modeler were conducted without being aware of the feature history. As illustrated, various fillets have been removed, the width of the model has decreased, a pattern of holes has been modified, etc. Once imported back in the parametric modeler, the problem is to find the series of parameter and feature edits to the original model that will generate the same resulting solid model body (i.e., that was created in the explicit modeler illustrated in FIG. 4B).

Figure 4C:
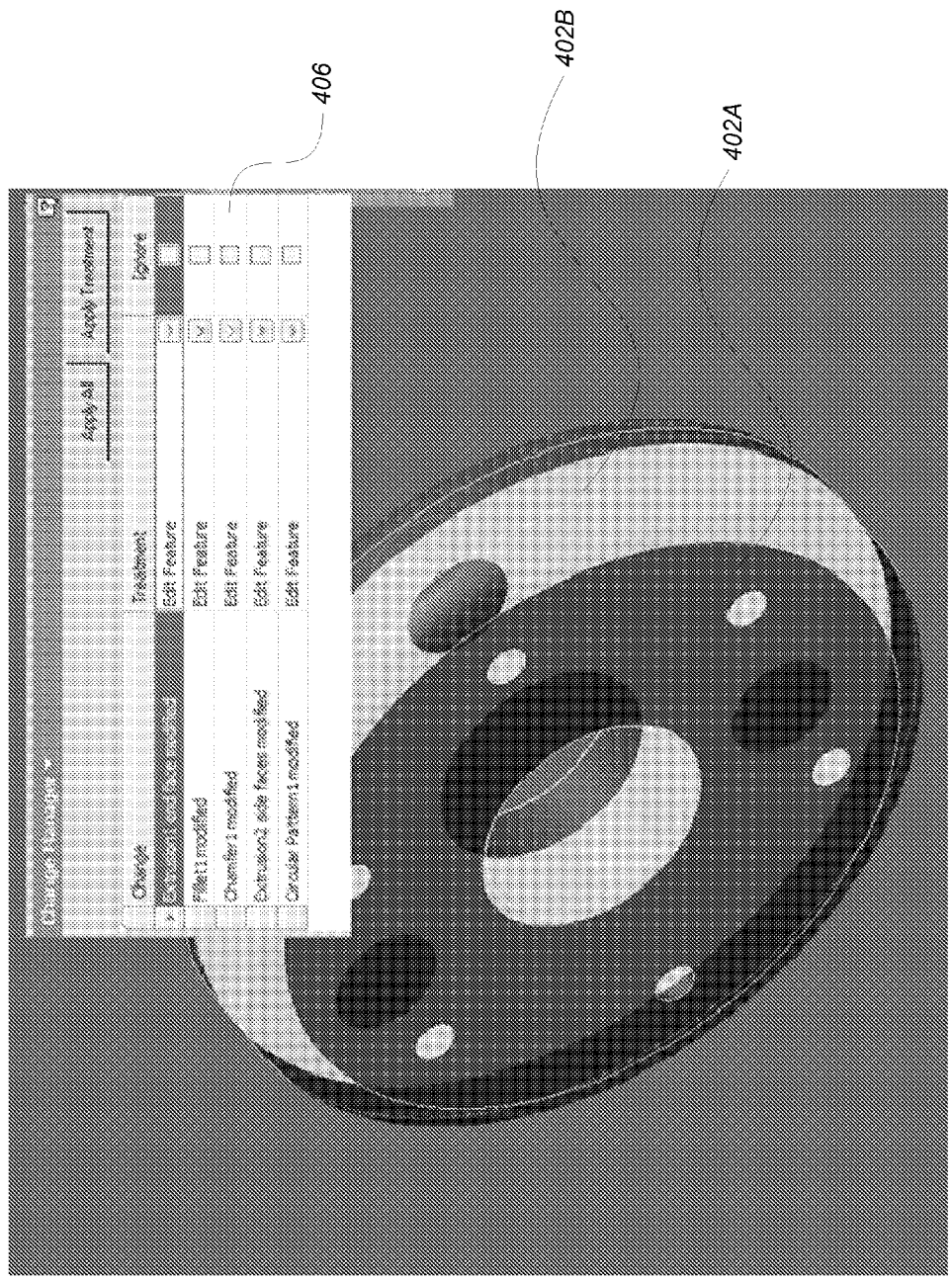
FIG. 4C illustrates the parametric model of FIG. 4A and the history free model of FIG. 4B with a list of feature centric changes or "treatments" illustrated in a Change Manager window in accordance with one or more embodiments of the invention.

As described above, embodiments of the invention conduct an analysis to identify the differences and prepare a list of "treatments" that can be applied to the model to affect the same result as that shown in the history free model. FIG. 4C illustrates the parametric model 402A and the history free model 402B with a list of feature centric changes or "treatments" illustrated in the Change Manager window 406. In window 406, each change is identified along with the treatment that can be used to achieve the change. The modifications are classified by the feature history. A set of edits, presented as "treatments," are offered for each feature difference. The user can apply a treatment, ignore certain changes or simply "apply all" to incorporate the changes back in the original parametric model. Once one or more of the treatments are selected and applied, the parametric modeler will identify each of the changes in the feature history of the parametric model itself. Accordingly, all of the changes can be edited at any time using the feature history list. Thus, the modifications made in the history-free modeler are essentially converted into individual actions that can be identified in a feature history, where such actions are incorporated into the feature history for the original model.

Graphically, the differences may also be viewed. For example, faces/elements may high-light as the user moves a cursor (e.g., via a cursor control device or mouse) over a particular element. Such highlighting may also be reflected in the Change Manager window 406. For example, when a user selects a particular text edit in the Change Manager window 406, the corresponding change may be highlighted graphically on the model itself. Similarly, if a user moves a cursor over a particular element in the graphic model 402A/402B, the corresponding text change/treatment in window 406 may be highlighted.

The issue that arises is to how the changes to the model are tracked from the parametric modeler to the explicit modeler and back. Regardless of whether in a parametric modeler or explicit modeler, a model consists of geometry such as a boundary representation. In this regard, a solid may be represented in a modeler by means of a boundary representation (b-rep) model. The boundary representation comprises a hierarchy of topological objects that define the boundaries of successively simpler elements of the model. Embodiments of the invention may compare the differences between any two faces or b-reps.

To determine the differences, when a feature is created in either a parametric modeler or history free modeler, a tag is assigned/associated with the feature. Such a tag may be viewed as an attribute of the particular feature or face that uniquely identifies the feature/face. Such tagging may be associated with any geometry, attribute or other element in a model (in both a parametric model and explicit model). Such tags are utilized in both type of modelers. There are three different types of edits that may be performed in an explicit modeler—(1) geometry/face/b-rep may be added; (2) a geometry/face/b-rep may be deleted; and/or (3) a geometry/face/b-rep may be modified (e.g., a face may be moved). Thus, if a new feature is created in an explicit modeler, a tag is created in the explicit modeler that is associated with the new face/feature.

When a model has been edited or created in an explicit modeler and is brought back into a parametric modeler, the tags/attributes and the associated location of the underlying geometry/features in the model 402B are examined and compared to the tags and associated location in the original model 402A. The comparison determines if tags are missing, the same, or if associated geometry/faces are in a different location between the two models. Thus, if a face in the original model 402A has the same tag as a face in the modified model 402B and the associated content/geometry is in the same location, it can be determined that such a face has not been modified. Alternatively, if the tags exist in both models 402A and 402B but the associated content/geometry is in a different location, a determination can be made that the content has been moved to a new location. If tags are missing in either the original model 402A or the explicit model 402B, a determination can be made that a face/geometry has been added/deleted during an edit.

It may be noted that the tags themselves may be implemented in a variety of different formats (e.g., XML, object identifiers, etc.). The particular format in which they are represented in the models 402A and 402B is not germane to the invention.

Once a determination has been made that a feature has been modified in the explicit modeler, embodiments of the invention attempt to create a series of treatments, for use in the parametric modeler, that will most closely/accurately resemble the modification. The steps for creating the series of treatments progress from more to less robust operations. In this regard, embodiments will first try to modify an underlying actual feature, then proceed to moving a face, and last attempt to use an extract/create face operation. Each of these steps will be described below.

As a first step, embodiments of the invention attempt to modify the underlying actual feature from the original parametric based model. Embodiments attempt to find a fully parametric edit to existing faces/features/geometry that will match the edits performed in the explicit modeler. Types of edits may include the modification of parameters, a modification to the shape/position of sketch geometry or the deletion of constraints from a sketch (e.g., the deletion of an equation that controls modification of a feature). Exemplary edits may further modifications/additions/deletions of fillets, chamfers, extrusions, revolutions, patterns, and holes.

However, it may be physically impossible to find such a parametric edit. For example, such edits may be limited by constraints on the face/geometry. If it is not possible to make a change to existing geometry, a move face command is attempted. For example, a face may be pulled off a certain distance in a fully parametric manner. By attempting to move a face, the move will show up in the feature history as a fully parametric feature. Thus, as an example, the first step would attempt to find a change to an extrusion to modify the extrusion to the right shape. If not possible, the second step would be to move the face. Such a move face command copies a face from the explicit modeler and converts the face to a parametric associative face in the parametric modeler. The parametric associative face is fully and directly editable using parametric based commands.

If neither a face/geometry modification or move face command is able to match the new geometry (as modified in the explicit modeler), a new face/geometry may be created (e.g., using a variety of commands such as the "sculpt command" from the Inventor™ 3D digital modeling application available from the assignee of the present invention). Such a face/geometry creation operation may copy the object from the explicit modeler into the parametric modeler and then attempt to mold/sculpt the object to create a solid model. Further, the face/geometry creation operation may include/combine several independent commands/operations (e.g., a face deletion, surface trimming, splitting, stitching, sweeping, etc.). Such an object is often not parametrically based and rather than integrating into the existing feature history using existing faces from the original parametric model, the new face/geometry creation command creates a new feature history.

Once the different sets of treatments have been identified per this series of steps, the different treatments are presented to the user. The treatments may further be color-coded (e.g., in the graphical image showing the comparison such as in FIG. 4C and/or in the textual feature treatment list) to provide information to the user. For example, treatments may be indicated in red to show deleted features (e.g., a fillet), green shading/coloring may be used to indicate newly-created features, blue shading/coloring may be used to identify old positions (e.g., from the original parametric model of FIG. 4A), and yellow shading/coloring may be used to indicate a new position (e.g., of the edited model in FIG. 4C).

Once the user has opted to apply a treatment, the treatment may affect other features of the model. For example, the feature affected by the treatment may have downstream dependencies that depend on the feature (e.g., based on constraints). Accordingly, embodiments of the invention reanalyze the new parametric model against the model in the explicit modeler to determine/obtain a new list of changes/treatments. The above process of accepting treatments and reanalyzing are repeated until the changes/treatments discovered are insignificant (e.g., small or beneath a threshold/level of tolerance) or non-existent. Such a threshold/level of tolerance may be based on differences in pixels between the two models, parameter differences of a certain number, boundary representation (b-rep) differences, geometric differences, or a variety of other factors.

Logical Flow

Figure 5:
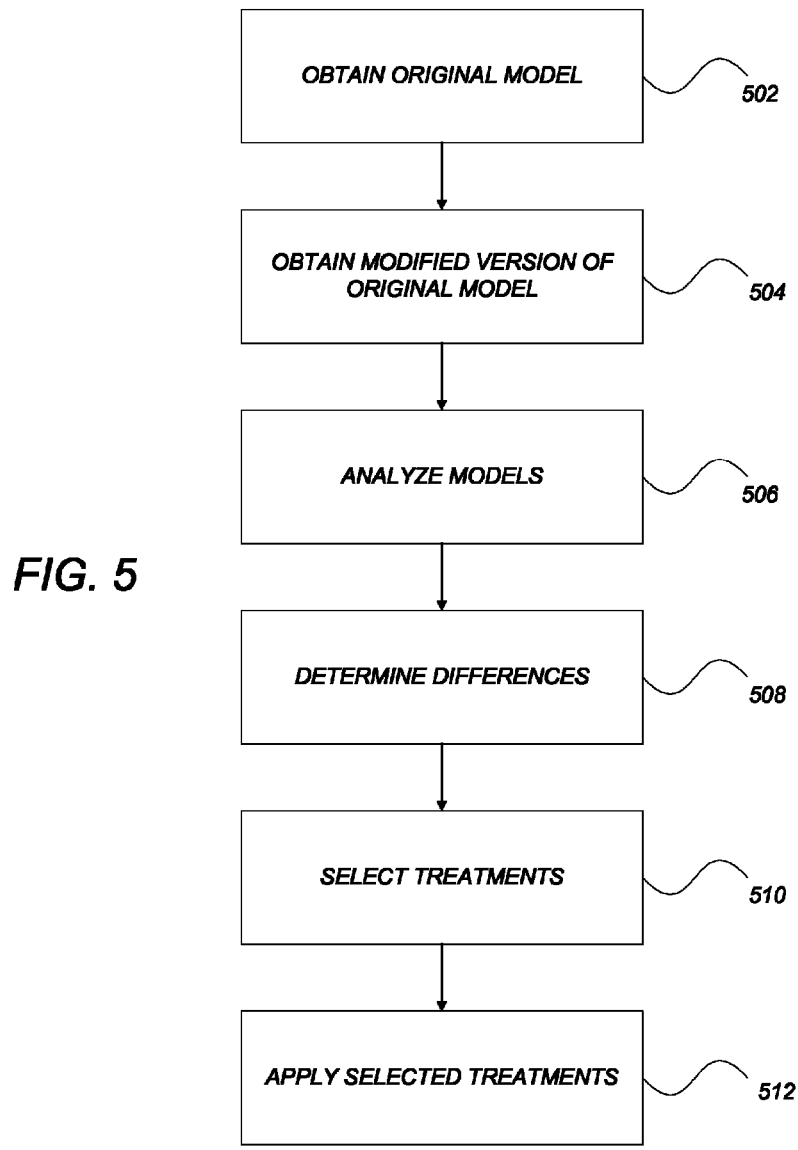
FIG. 5 is a flowchart illustrating the logical flow for managing modifications to a solid between different modeling applications in accordance with one or more embodiments of the invention.

FIG. 5 is a flowchart illustrating the logical flow for managing modifications to a solid between different modeling applications in accordance with one or more embodiments of the invention. Each of the steps (or a subset of the steps) may be performed using an add-in/add-on to a parametrically-based modeler.

At step 502, an original model created using a parametrically-based modeler is obtained in the parametrically-based modeler.

At step 504, a modified version of the original model is obtained in the parametrically based modeler. The modified version was edited/created using a history-free modeler.

At step 506, the original model and modified version are analyzed/compared to determine one or more differences between them. The analyzing may compare feature tags assigned to each feature in the original model to feature tags assigned/associated with each feature in the modified version. Based on the comparison, the parametric modeler may determine if any feature from the original model or the modified version has been added, removed, or modified.

At step 508, based on the differences, a set of one or more parametric-based treatments are determined. The treatments, when performed on the original model, affect changes that produce a parametrically-driven version of (and/or that geometrically matches) the modified version. The treatments may be based on a three step process. In the first process, a fully parametric modification to a feature in the original model is performed if possible. If not possible, a face from the modified version is copied to the parametric modeler. Thereafter, a parametric move face operation is performed on the copied face, if possible. If the move face operation is not possible, a create new face/geometry command is performed on the copied face.

At step 510, one or more of the treatments are selected. Each treatment in the set is individually selectable for application to the original model. To enable the selection, the set of treatments may be displayed in a text list.

At step 512, the selected treatments are applied to the original model to produce the parametrically-driven version of the modified version. The applied treatments may be added to a feature history of the parametrically-driven version of the model. In addition, if the selected treatments have downstream dependencies, the determining step 508, selecting step 510, and applying step 512 are repeated (until no more changes or few changes are needed). Further, the history of the treatments that are presented to the user may be maintained stored. Alternatively, once a treatment is applied, the non-selected treatments may be discarded.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for managing modifications to a solid model between different modeling applications, comprising:
obtaining an original model created using a parametrically-based modeler, in the parametrically-based modeler;
obtaining, in the parametrically-based modeler, a modified version of the original model, wherein the modified version was edited using a history-free modeler;
analyzing the original model and the modified version of the original model to determine one or more differences between the original model and the modified version of the original model;
determining, based on the one or more differences, a set of one or more parametric-based treatments that, when performed on the original model, affect changes that produce a parametrically-driven version of the modified version;
selecting one or more of the parametric-based treatments, wherein each parametric-based treatment in the set is individually selectable for application to the original model; and
applying the one or more selected parametric-based treatments to produce the parametrically-driven version of the modified version.

2. The computer-implemented method of claim 1, wherein the analyzing, determining, selecting, and applying steps are performed using an add-in to the parametrically-based modeler.

3. The computer-implemented method of claim 1, wherein the set of one or more parametric-based treatments are displayed in a text list.

4. The computer-implemented method of claim 1, wherein the applied one or more selected parametric-based treatments are added to a feature history of the parametrically-driven version of the modified version.

5. The computer-implemented method of claim 1, wherein the analyzing comprises:
comparing one or more feature tags assigned to each feature in the original model to one or more feature tags assigned to each feature in the modified version; and
based on the comparison determining if any feature from the original model or the modified version have been added, removed, or modified.

6. The computer-implemented method of claim 1, wherein the one or more parametric-based treatments in the set comprise:
determining that performing a fully parametric modification to a feature in the original model is not possible; and
copying a face of the modified version, and performing a parametric move face operation on the copied face.

7. The computer-implemented method of claim 1, further comprising:
determining if the applied one or more selected parametric-based treatments have downstream dependencies; and
if there are downstream dependencies, repeating the steps of determining the set of one or more parametric-based treatments, selecting one or more of the parametric-based treatments, and applying the one or more selected parametric based treatments.

8. An apparatus for managing modifications to a solid model between different modeling applications in a computer system comprising:
(a) a computer having a memory;
(b) a parametrically-based modeler executing on the computer, wherein the parametrically-based modeler is configured to:
(i) obtain an original model created using the parametrically-based modeler;
(ii) obtain a modified version of the original model, wherein the modified version was edited using a history-free modeler;
(iii) analyze the original model and the modified version of the original model to determine one or more differences between the original model and the modified version of the original model;
(iv) determine, based on the one or more differences, a set of one or more parametric-based treatments that, when performed on the original model, affect changes that produce a parametrically-driven version of the modified version;
(v) select one or more of the parametric-based treatments, wherein each parametric-based treatment in the set is individually selectable for application to the original model; and
(vi) apply the one or more selected parametric-based treatments to produce the parametrically-driven version of the modified version.

9. The apparatus of claim 8, wherein the parametrically-based modeler further comprises an add-in that is configured to perform the analyze, determine, select, and apply steps.

10. The apparatus of claim 8, wherein the set of one or more parametric-based treatments are displayed in a text list.

11. The apparatus of claim 8, wherein the applied one or more selected parametric-based treatments are added to a feature history of the parametrically-driven version of the modified version.

12. The apparatus of claim 8, wherein the parametrically-based modeler is configured to analyze by:
comparing one or more feature tags assigned to each feature in the original model to one or more feature tags assigned to each feature in the modified version; and
based on the comparison determining if any feature from the original model or the modified version have been added, removed, or modified.

13. The apparatus of claim 8, wherein the one or more parametric-based treatments in the set comprise:
determining that performing a fully parametric modification to a feature in the original model is not possible; and
copying a face of the modified version, and performing a parametric move face operation on the copied face.

14. The apparatus of claim 8, wherein the parametrically-based modeler is further configured to:
determine if the applied one or more selected parametric-based treatments have downstream dependencies; and
if there are downstream dependencies, repeating the steps of determining the set of one or more parametric-based treatments, selecting one or more of the parametric-based treatments, and applying the one or more selected parametric based treatments.

15. A non-transitory computer readable storage medium encoded with computer program instructions which when accessed by a computer cause the computer to load the program instructions to a memory therein creating a special purpose data structure causing the computer to operate as a specially programmed computer, executing a method of managing modifications to a solid model between different modeling applications, comprising:
- (a) obtaining, in the specially programmed computer in a parametrically-based modeler, an original model created using the parametrically-based modeler;
- (b) obtaining, in the specially programmed computer in the parametrically-based modeler, a modified version of the original model, wherein the modified version was edited using a history-free modeler;
- (c) analyzing, in the specially programmed computer, the original model and the modified version of the original model to determine one or more differences between the original model and the modified version of the original model;
- (d) determining, in the specially programmed computer, based on the one or more differences, a set of one or more parametric-based treatments that, when performed on the original model, affect changes that produce a parametrically-driven version of the modified version;
- (e) selecting, in the specially programmed computer, one or more of the parametric-based treatments, wherein each parametric-based treatment in the set is individually selectable for application to the original model; and
- (f) applying, in the specially programmed computer, the one or more selected parametric-based treatments to produce the parametrically-driven version of the modified version.

16. The non-transitory computer readable storage medium of claim 15, wherein the analyzing, determining, selecting, and applying steps are performed using an add-in to the parametrically-based modeler.

17. The non-transitory computer readable storage medium of claim 15, wherein the set of one or more parametric-based treatments are displayed in a text list.

18. The non-transitory computer readable storage medium of claim 15, wherein the applied one or more selected parametric-based treatments are added to a feature history of the parametrically-driven version of the modified version.

19. The non-transitory computer readable storage medium of claim 15, wherein the analyzing comprises:
- comparing one or more feature tags assigned to each feature in the original model to one or more feature tags assigned to each feature in the modified version; and
- based on the comparison determining if any feature from the original model or the modified version have been added, removed, or modified.

20. The non-transitory computer readable storage medium of claim 15, wherein the one or more parametric-based treatments in the set comprise:
- determining that performing a fully parametric modification to a feature in the original model is not possible; and
- copying a face of the modified version, and performing a parametric move face operation on the copied face.

21. The non-transitory computer readable storage medium of claim 15, further comprising:
- determining if the applied one or more selected parametric-based treatments have downstream dependencies; and
- if there are downstream dependencies, repeating the steps of determining the set of one or more parametric-based treatments, selecting one or more of the parametric-based treatments, and applying the one or more selected parametric based treatments.

* * * * *